(12) United States Patent
Sharma

(10) Patent No.: US 6,819,587 B1
(45) Date of Patent: Nov. 16, 2004

(54) THERMAL-ASSISTED NANOTIP MAGNETIC MEMORY STORAGE DEVICE

(75) Inventor: Manish Sharma, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 12 days.

(21) Appl. No.: 10/460,785

(22) Filed: Jun. 12, 2003

(51) Int. Cl.[7] .............................................. G11C 11/15
(52) U.S. Cl. ....................................... 365/173; 365/171
(58) Field of Search ................................ 365/173, 171, 365/158, 209, 213, 232

(56) References Cited

U.S. PATENT DOCUMENTS

| 6,385,082 | B1 | * | 5/2002 | Abraham et al. | 365/171 |
| 6,404,647 | B1 | * | 6/2002 | Minne' | 361/760 |
| 6,507,552 | B2 | * | 1/2003 | Gibson | 369/126 |
| 6,538,917 | B1 | * | 3/2003 | Tran et al. | 365/158 |
| 6,538,920 | B2 | * | 3/2003 | Sharma et al. | 365/171 |

FOREIGN PATENT DOCUMENTS

| EP | 0734017 B1 | 11/2001 |
| EP | 0784847 B1 | 2/2002 |
| EP | 1211680 A2 | 6/2002 |
| EP | 1233412 A2 | 8/2002 |
| EP | 1251503 A2 | 10/2002 |
| EP | 1260481 A2 | 11/2002 |
| EP | 1261023 A2 | 11/2002 |
| EP | 1261024 A2 | 11/2002 |

* cited by examiner

*Primary Examiner*—Anh Phung

(57) ABSTRACT

This invention provides thermal-assisted nanotip magnetic memory storage device. In a particular embodiment, a cross-point array of conductive rows and columns is provided with tunnel junction magnetic memory cells provided at the intersections between the rows and columns. Each cell provides a magnetic data layer characterized by a material wherein the coercivity is decreased upon an increase in temperature, an intermediate layer, and a reference layer. At least one movable probe having a tip characterized by a heat generator is also provided. The movable probe may be placed proximate to a given memory cell so as to thermally influence a given memory cell. The magnetic fields provided during a read operation are not sufficient to alter the magnetic orientation of an unheated data layer, but may alter the data layer of a memory cell warmed by heat provided by the movable probe.

25 Claims, 4 Drawing Sheets

THERMAL-ASSISTED NANOTIP MAGNETIC MEMORY STORAGE DEVICE

FIELD OF THE INVENTION

This invention relates generally to ultra-high density thermally assisted magnetic memory devices, and in particular to nanotip probe based magnetic memory arrays.

BACKGROUND OF THE INVENTION

Today's computer systems are becoming increasingly sophisticated, permitting users to perform an ever greater variety of computing tasks at faster and faster rates. The size of the memory and the speed at which it can be accessed bear heavily upon the overall speed of the computer system.

Memory for a computer system is technically any form of electronic, magnetic or optical storage; however it is generally divided up into different categories based in part upon speed and functionality. The two general categories of computer memory are main memory and mass storage. Main memory is generally comprised of fast, expensive volatile random access memory that is connected directly to the processor by a memory buss. One component of the speed in main memory is generally that access to a particular memory cell is handled without physical movement of components.

Mass storage devices are typically permanent non-volatile memory stores which are understood to be less expensive, slow, large capacity devices such as hard drives, tape drives, optical media, and other mass storage devices. The primary objective of mass storage devices is to store an application or data until it is required for execution in main memory. In contrast to the main memory stores that may operate with access times of less than 100 nanoseconds, these mass storage devices operate with access times generally in excess of 1 millisecond.

Generally, the principle underlying the storage of data in a magnetic media (main or mass storage) is the ability to change, and or reverse, the relative orientation of the magnetization of a storage data bit (i.e the logic state of a "0" or a "1"). The coercivity of a material is the level of demagnetizing force that must be applied to a magnetic particle to reduce and or reverse the magnetization of the particle. Generally speaking, the smaller the magnetic particle the higher it's coercivity.

A prior art magnetic memory cell may be a tunneling magnetoresistance memory cell (TMR), a giant magnetoresistance memory cell (GMR), or a colossal magnetoresistance memory cell (CMR), each of which generally includes a data layer (also called a storage layer or bit layer), a reference layer, and an intermediate layer between the data layer and the reference layer. The data layer, the reference layer, and the intermediate layer can be made from one or more layers of material.

The data layer is usually a layer of magnetic material that stores a bit of data as an orientation of magnetization that may be altered in response to the application of external magnetic fields. More specifically, the orientation of magnetization of the data layer representing the logic state can be rotated (switched) from a first orientation representing a logic state of "0" to a second orientation, representing a logic state of "1", and/or vice versa.

The reference layer is usually a layer of magnetic material in which an orientation of magnetization is "pinned", as in fixed, in a predetermined direction. Often several layers of magnetic material are required and function as one to effectuate a stable pinned reference layer. The predetermined direction is determined and established by microelectronic processing steps employed in the fabrication of the magnetic memory cell.

Typically, the logic state (a "0" or a "1") of a magnetic memory cell depends on the relative orientations of magnetization in the data layer and the reference layer. For example, when an electrical potential bias is applied across the data layer and the reference layer in a TMR cell (also known as a tunnel junction memory cell), electrons migrate between the data layer and the reference layer through the intermediate layer. The intermediate layer is typically a thin dielectric layer commonly referred to as a tunnel barrier layer. The phenomena that cause the migration of electrons through the barrier layer may be referred to as quantum mechanical tunneling or spin tunneling. The logic state may be determined by measuring the resistance of the memory cell. For example, if the overall orientation of the magnetization in the data storage layer is parallel to the pinned orientation of magnetization in the reference layer the magnetic memory cell will be in a state of low resistance. If the overall orientation of the magnetization in the data storage layer is anti-parallel (opposite) to the pinned orientation of magnetization in the reference layer the magnetic memory cell will be in a state of high resistance.

In an ideal setting the orientation of the alterable magnetic field in the data layer would be either parallel or anti-parallel with respect to the field of the reference layer. As both the data layer and the reference layer are generally both made from ferromagnetic materials and are positioned in close permanent proximity to each other, the generally stronger reference layer may affect the orientation of the data layer. More specifically, the magnetization of the reference layer may generate a demagnetization field that extends from the reference layer into the data layer.

The result of this demagnetization field from the reference layer is an offset in the coercive switching field. This offset can result in an asymmetry in the switching characteristics of the bit: the amount of switching field needed to switch the bit from parallel to anti-parallel state is different from the switching field needed to switch the bit from anti-parallel state to parallel state. To have reliable switching characteristics and to simplify the read/write circuitry, it is desirable to have this offset reduced to as near zero as possible.

The magnetoresistance $\Delta R/R$ may be described as akin to a signal-to-noise ratio S/N. A higher S/N results in a stronger signal that can be sensed to determine the state of the bit in the data layer. Thus, at least one disadvantage of a tunnel junction memory cell having a pinned reference layer in close and fixed proximity to the data layer is a potential reduction in the magnetoresistance $\Delta R/R$ resulting from the angular displacement.

To pin the reference layer during manufacturing, the reference layer must be heated to an elevated temperature in an annealing step. The annealing step typically takes time, perhaps an hour or more. As the reference layer is but one part of the memory being produced, the entire memory must be subject to temperatures ranging from about 200 to 300 degrees centigrade while under the influence of a constant and focused magnetic field. Such manufacturing stresses may permit the reference layer to become un-pinned and lose it's set orientation if the memory is later subjected to high temperatures. In addition, the characteristics of the data layer may be unknowingly affected by the annealing heat during some manufacturing processes.

To facilitate establishing a pinned reference layer it is not uncommon for the reference layer to include multiple layers of material. While utilizing multiple layers may help insure that the reference layer remains pinned, it also raises the complexity of manufacturing each and every memory cell present in the magnetic memory.

As computer manufacturers and code developers strive to achieve faster and more powerful systems and applications, the speed of access and total memory capacity of mass storage devices become focal points of concern. Advances in technology have greatly increased the storage capacity of both main memory and mass storage devices. However generally speaking mass storage devices employ a system of physical movement to read and write data over high cost electronic access methods utilized in traditional main memory. For example, with a hard drive the read/write head must: 1) move to the appropriate radial location over the spinning disk; and 2) wait for the spinning disk to rotate sufficiently to place the desired data bit directly in line with the read/write head. Main memory devices such as magnetic random access memory (MRAM) often employ tunnel junction magnetic memory cells positioned at the transverse intersections of electrically conductive rows and columns. Such an arrangement is known as a cross-point memory array.

In a typical cross-point memory array, while any given row (row A, B, C . . .) may cross every column (column 1, 2, 3 . . .), and visa-versa, the traditional principles of column and row arrays dictate that any given row will only cross any given column once. Therefore, by accessing a particular row (B) and a particular column (3), any one memory cell positioned at their intersection (B,3) can be isolated from any other memory cell in the array. Such individual indexing is not without complexities.

As between the two fundamental operations that may be performed on a storage bit (a "write" or a "read"), the write operation is generally more complex. In many operations write operations occur less frequently then read operations, and, in certain situations, may occur orders of magnitude less often.

With respect to traditional cross-point memory arrays, while the magnetic field of the data layer of a desired cell may be altered, it is desirable not to adversely affect or alter the data layers of neighboring cells. Therefore, design and manufacturing issues are generally focused upon the requirements imposed by the write operation. As write operations generally requiring greater electrical current and magnetic fields, requiring more robust characteristics in the power supply, row and column conductors and appropriate buffering space.

With respect to magnetic memory components, it is well known that as size decreases coercivity increases. A large coercivity is generally undesirable as it requires a greater electrical field to be switched, which in turn requires a greater power source and potentially larger conductor. Providing large power sources and large conductors is generally at odds with the focus of nanotechnology to reduce the necessary size of components. In addition, to mitigate the potential of inadvertently switching a neighboring memory cell, nanometer scaled memory cells are generally more widely spaced relative to their overall size than are non-nanometer sized memory cells. Moreover, as the size of the magnetic memory decreases, the unused space between individual memory cells tends to increase.

Hence, in a nanotip magnetic memory array a significant amount of overall space may be used simply to provide a physical buffer between the cells. Absent this buffering space, or otherwise reducing it's ratio, a greater volume of storage in the same physical space could be obtained. In addition, the large currents and potentially large conductors impose physical stresses upon the design and implementation of nanotip probes.

Hence, there is a need for an ultra-high density nanotip memory array which overcomes one or more of the drawbacks identified above. The present invention satisfies one or more of these needs.

SUMMARY

This invention provides a nanotip cross-point magnetic memory array with thermally assisted switching.

In particular, and by way of example only, according to an embodiment of the present invention, this invention provides a thermal-assisted nanotip magnetic memory storage device including: a cross point array of magnetic tunnel junction memory cells, the memory cells including a material wherein the coercivity is decreased upon an increase in temperature; and at least one movable probe with a distal tip positioned within close proximity of a given memory cell, the probe including, a heat generator joined to the support and forming the distal tip.

Moreover, according to an embodiment thereof, the invention may provide a thermal-assisted nanotip magnetic memory storage device including: a plurality of parallel electrically conductive rows; a plurality of parallel electrically conductive columns transverse to the rows, the columns and rows thereby forming a cross point array with a plurality of intersections; a plurality of magnetic tunnel junction memory cells, each memory cell located at an intersection between a row and column, the memory cells including a material with an alterable orientation of magnetization, wherein the coercivity of the alterable material is decreased upon an increase in temperature; and at least one movable probe with a distal tip positioned within close proximity of a given memory cell, the probe including; a support; a heat generator joined to the support and forming the distal tip.

In yet another embodiment, the invention may provide a thermal-assisted nanotip magnetic memory storage device including: a plurality of parallel electrically conductive rows; a plurality of parallel electrically conductive columns transverse to the rows, the columns and rows thereby forming a cross point array with a plurality of intersections; a plurality of memory cells, each memory cell located at an intersection between a row and column, each memory cell including: at least one ferromagnetic data layer characterized by an alterable orientation of magnetization, the ferromagnetic data layer including a material wherein the coercivity is decreased upon an increase in temperature; an intermediate layer in contact with the data layer; a ferromagnetic reference layer in contact with the intermediate layer, opposite from the data layer; at least one movable probe with a distal tip positioned within close proximity of a given memory cell, the probe including: a support; a heat generator joined to the support and forming the distal tip.

These and other objects, features and advantages of the preferred method and apparatus will become apparent from the following detailed description, taken in conjunction with the accompanying drawings which illustrate, by way of example the principles of the invention.

DETAILED DESCRIPTION

Before proceeding with the detailed description, it is to be appreciated that the present invention is not limited to use or application with a specific type of magnetic memory. Thus, although the present invention is, for the convenience of explanation, depicted and described with respect to typical exemplary embodiments, it will be appreciated that this invention may be applied with other types of magnetic memory.

Figure 1:
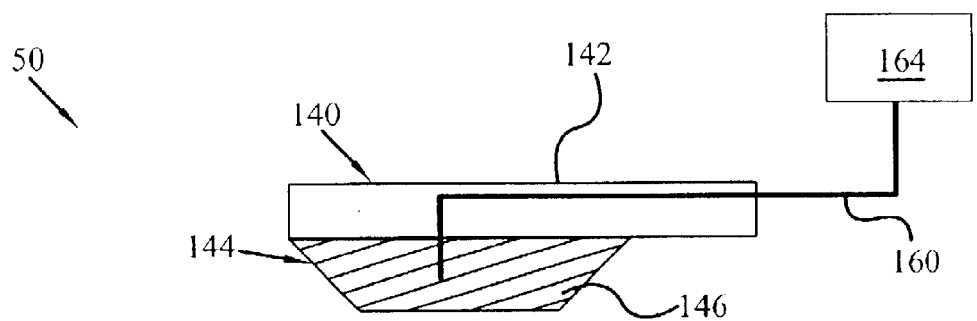
FIG. 1 shows a portion of an exemplary thermal nanotip assisted cross point magnetic memory embodying the present invention.
Figure 1:
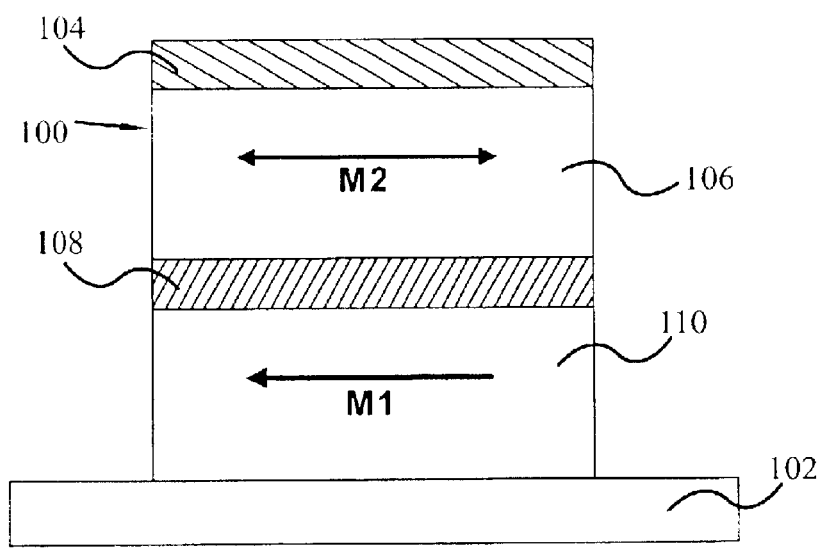

Referring now to the drawings, and more particularly to FIG. 1 there is shown a portion of a thermal nanotip assisted cross point magnetic memory 50, having at least one magnetic memory cell 100 and movable probe 140 positioned proximate to the memory cell 100, according to an embodiment of the present invention. In at least one embodiment, the magnetic memory cell 100 may be a magnetic tunnel junction memory cell. Specifically, the memory 50, provides a plurality of parallel electrically conductive rows and parallel electrically conductive columns transverse to the rows. The memory cell 100 is located at the intersection of a row 102 and a column 104.

The magnetic memory cell 100 itself may have a ferromagnetic data layer 106, a intermediate layer 108, and ferromagnetic reference layer 110 with orientation of magnetization M1.

The ferromagnetic data layer 106 permits the storing of a bit of data as an alterable orientation of magnetization M2. The intermediate layer 108 has opposing sides such that the data layer 106 in contact with one side is in direct alignment with, and substantially uniformly spaced from, the reference layer 110, in contact with the second side of the dielectric intermediate layer 108. The row 102 is in electrical contact with the reference layer 110 and the column 104 is in electrical contact with the data layer 106. Under appropriate circumstances this order of arrangement may be reversed.

The movable probe 140 has an articulating support 142 and a distal tip 144 that may be positioned within close proximity of a given memory cell 100. As shown in FIG. 1, in at least one embodiment, the probe's distal tip 144 is characterized by a heat generator 146. The heat generator 146 may form the distal tip 144. The tip 144 of probe 140 is sized to be substantially about the same size or smaller than the diameter of a given memory cell 100. As is conceptually shown, the tip 144 may be conical, such that it is smaller proximate to the memory cell 100. Although one nanotip probe 140 is shown, under appropriate circumstances an array of movable nanotip probes may be provided and supported above the array of the memory cells 100.

The reference layer 110 may be a pinned or soft reference layer. In at least one embodiment the reference layer 110 is a soft reference layer, so named because the direction of orientation of magnetization M1 can be dynamically set to a known direction by magnetic fields provided by an externally supplied current flowing through the row 102 and column 104 conductors intersecting at the memory cell 100. It is termed "soft" because it generally comprises materials that are magnetically soft and are not of the usual hard-pinned materials used for more traditional pinned reference layers.

In at least one embodiment, the ferromagnetic data layer 106 has a lower coercivity then the reference layer 110. The ferromagnetic data layer 106 may be made from a material that includes, but it not limited to: Nickel Iron (NiFe), Nickel Iron Cobalt (NiFeCo), Cobalt Iron (CoFe), and alloys of such metals. Under appropriate circumstances, such as manufacturing preferences, the memory cell 100 may further include additional electrical conductors located between the data layer 106 and column 104, and likewise between the reference layer 110 and row 102. In addition, both the reference layer 110 and the data layer 106 may be formed from multiple layers of materials. However, for conceptual simplicity and ease of discussion, each layer component is herein discussed as a single layer.

The nanotip probe 140 is movable and as such can be moved from a location proximate to one memory cell 100 to a location proximate to another memory cell. Specifically, the probe may be positioned along the X and Y coordinate axis above a given memory cell 100. The probe may then be positioned along the Z coordinate axis to permit the transfer of heat energy between the nanotip probe 140 and a given memory cell 100. The heat energy may be transferred conductively, radiantly, or via a combination of both. In general, the X and Y movement to align with a specific memory cell 100 will occur before movement along the Z axis.

The movement articulation of nanotip probe 140 may be achieved by components that one skilled in the art of probe based storage would know to use in order to position a nanotip probe, or array of probes, above the memory cells 100. In at least one embodiment the movement articulation may be accomplished with the use of electrostatic, piezoelectric, or a combination of electrostatic and piezoelectric positioners such as have been achieved using current MEMS (micro elector mechanical system) devices.

In yet another embodiment, the array of memory cells 100 may be movable, achieved as described above with respect to the probe 140. The movement of the memory cells 100 may combine in harmony with the movement of the probe 140 or probes to further improve the relative speed of access to any particular memory cell 100. Under appropriate circumstances, the relative movement of the probe 140 or probes may be accomplished entirely by movement of the memory cells 100. With respect to embodiments providing multiple probes 150, the probes 150 may be moved in tandem along the X, Y and Z axes, or individually along one or more of the axes.

Electrical connections, shown as wire(s) 160 in FIG. 1, connect the heat generator 146 to a remote power source 164. The power source permits the nanotip probe 140 to provide a localized heat to a specifically designated memory cell 100. In at least one embodiment, the heat generator 146 may be a planar resistor, a current carrying coil or other such device capable of providing a localized heat source.

Figure 2:
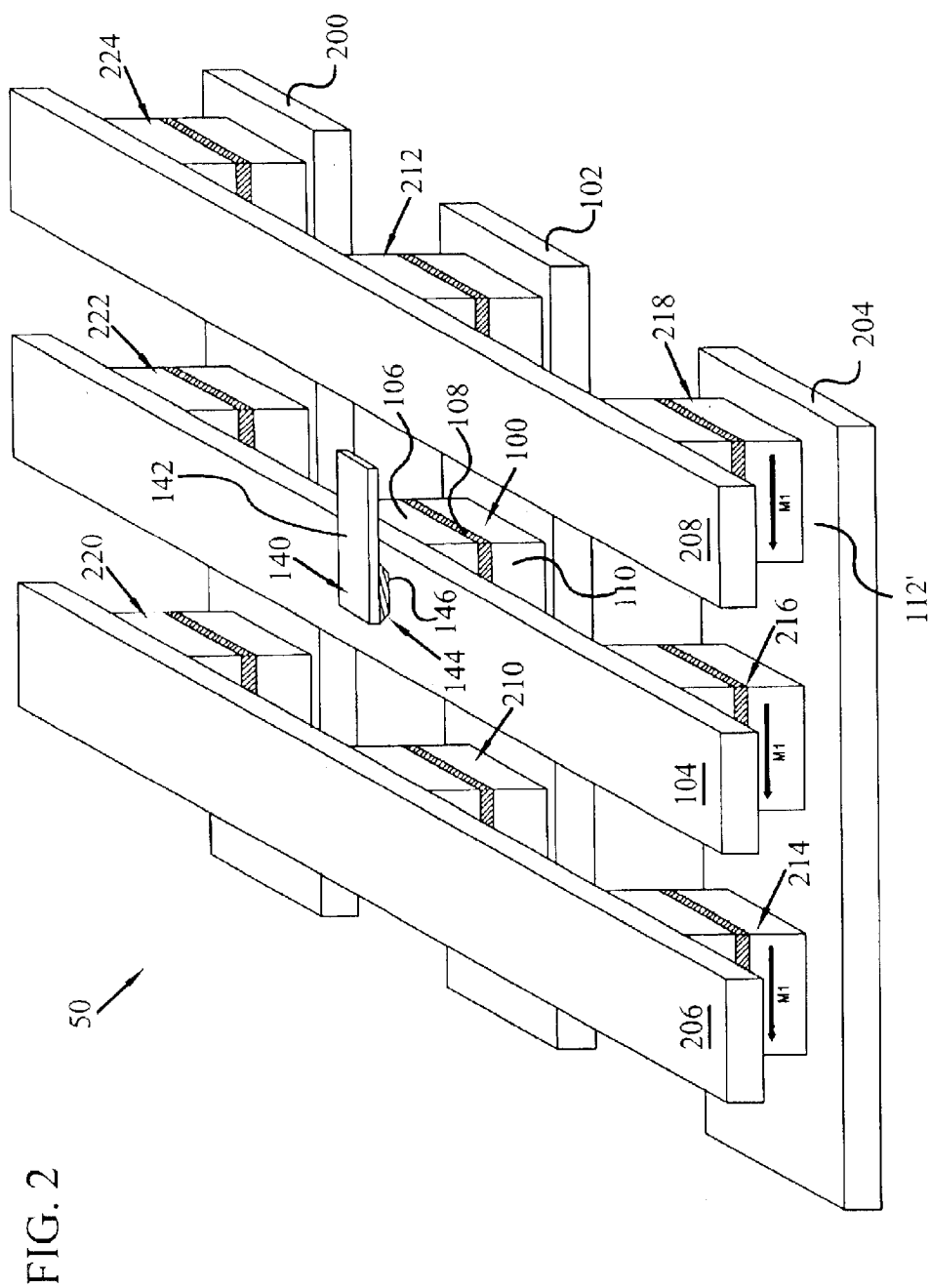
FIG. 2 is a perspective view of an array of memory cells as shown in FIG. 1.

As noted above, the magnetic memory 50 may have a plurality of memory cells 100 set out in an array at the cross points of rows (102, 200 and 204) and columns (104, 206 and 208) as shown in FIG. 2. Each memory cell, 100, 210, 212, 214, 216, 218, 220, 222, and 224 can be individually electrically identified by providing a current through a particular row and a particular column. In addition, the conceptual size and location of the movable probe 140 with the heat generator 146 can be more fully appreciated. Heat provided by the distal tip 144 may be localized to the memory cell 100, proximate to the location of the probe 140.

The phenomenon that causes the resistance in magnetic tunnel junction memory cell 100 is well understood in the magnetic memory art and is well understood for TMR memory cells. GMR and CMR memory cells have similar magnetic behavior but their magnetoresistance arises from different physical effects as the electrical conduction mechanisms are different. For instance, in a TMR-based memory cell, the phenomenon is referred to as quantum-mechanical tunneling or spin-dependent tunneling. In a TMR memory cell, the intermediate layer 108 is a thin barrier of dielectric material through which electrons quantum mechanically tunnel between the data layer 106 and the reference layer 110.

In a GMR memory cell, the intermediate layer 108 is a thin spacer layer of non-magnetic but conducting material. Here the conduction is a spin-dependent scattering of electrons passing between the data layer 106 and the reference layer 110 though the intermediate layer 108. In either case, the resistance between the data layer 106 and the soft reference layer 110 will increase or decrease depending on the relative orientations of the magnetic fields M1 and M2. It is that difference in resistance that is sensed to determine if the data layer 106 is storing a logic state of "0" or a logic state of "1".

In at least one embodiment, the intermediate layer 108 is a tunnel layer made from an electrically insulating material (a dielectric) that separates and electrically isolates the data layer 106 from the reference layer 110. Suitable dielectric materials for the dielectric intermediate layer 108 may include, but are not limited to: Silicon Oxide ($SiO_2$), Magnesium Oxide (MgO), Silicon Nitride ($SiN_x$), Aluminum Oxide ($Al_2O_3$), Aluminum Nitride ($AlN_x$), and Tantalum Oxide ($TaO_x$).

In at least one other embodiment, the intermediate layer 108 is a tunnel layer made from a non-magnetic material such as a 3d, a 4d, or a 5d transition metal listed in the periodic table of the elements. Suitable non-magnetic materials for a non-magnetic intermediate layer 108 may include, but are not limited to: Copper (Cu), Gold (Au) and Silver (Ag). While the actual thickness of the intermediate layer 108 is dependent upon the materials selected to create the intermediate layer 108 and the type of tunnel memory cell desired, in general, the intermediate layer 108 may have a thickness of about 0.5 nm to about 5.0 nm.

As stated, the nanotip probe 140 may be moved to a position substantially proximate to memory cell 100. The probe 140 may thereby thermally influence the given memory cell 100. In at least one embodiment, the proximate location may be physical contact between the distal tip 144 and the memory cell 100.

In many applications, read operations outnumber write operations by a considerable factor. The bit of data stored in the data layer 106 can be read during a read operation performed upon the magnetic memory cell 100 by passing a read current IR through a given row conductor and a given column conductor, and then measuring the resistance between the data layer 106 and the reference layer 110. The logical state of the bit as a "1" or a "0" can be determined by sensing the magnitude of the resistance.

Figure 3:
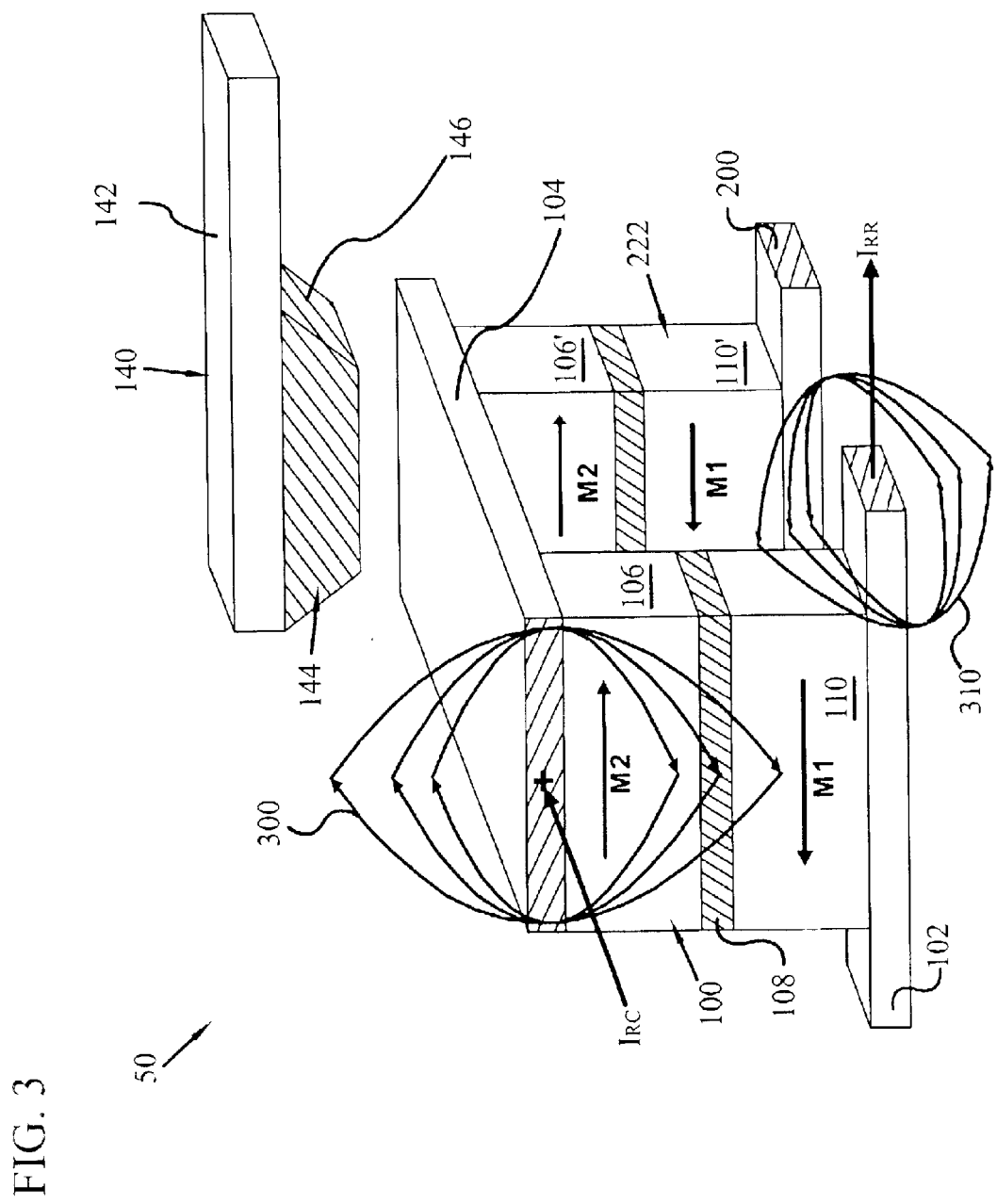
FIG. 3 is a perspective view illustrating the read operation of the memory shown in FIG. 1.

Shown in FIG. 3, an externally supplied read current $I_{RC}$ of a predetermined magnitude and direction is supplied through conductor column 104 resulting in the generation of a magnetic field (represented by curved arrows 300). In addition, an externally supplied read current $I_{RR}$ of a predetermined magnitude and direction is supplied through row 102 resulting in the generation of a magnetic field (represented by curved arrows 310). The location of movable probe 140 as proximate or distant to cell 100 is not generally of consequence to the read operation.

As introduced above, in at least one embodiment the reference layer 110 is a sort reference layer. In such an embodiment, the magnetic field M1 of a soft reference layer 110 is pinned-on-the-fly to a known orientation. As long as the known read current IR is flowing through the row and column, a resistance exists between the ferromagnetic data layer 106 and the soft ferromagnetic reference layer 110 due to the flow of electrons between the data layer 106 and the reference layer 110 through the intermediate layer 108. By measuring the magnitude and/or change in that resistance the state of the data bit stored in the data layer 106 can be determined.

Because the orientation of M1 is not pinned, a convention is generally adopted as to which way M1 will be oriented. For example, the conceptual arrangement in FIG. 3 may illustrate such a convention. As shown, the read current $I_{RC}$ of the column 104 is flowing into the page, indicated by the "+" symbol, such that the magnetic field 300 has a vector in the clockwise direction in accordance with the right-hand rule. The read current $I_{RR}$ of the row 102 is flowing along the page such that the magnetic field 310 of the row 102 cooperatively interacts with the magnetic field 300 of the column 104. The pinned-on-the-fly orientation of M1 is therefore towards the left. Further, the convention may be refined to state that a logic state of "0" exists where M1 and M2 are parallel, and a logic state of "1" exists where M1 and M2 are anti-parallel, comparisons determined by resistance.

The magnetic fields 300 and 310 are not sufficient, individually or collectively, to overcome the coercivity of the unheated data layer 106 of the given memory cell 100. As such the alterable nature of the magnetic field M2 of the data layer 106 is substantially unchanged. As the collective force of these fields is ineffective in their localized memory cell 100, it is unlikely that the magnetic fields 300 and 310 will adversely affect the data layers 106', of the adjacent memory cell 222 which is further removed from the influence of magnetic fields 300 and 310 by physical placement. In addition, although the orientation of M1 of the soft reference layer 110 may be pinned-on-the-fly, M1 generally will not remain pinned when magnetic fields 300 and 310 are removed by the cessation of current.

It is generally appreciated in the magnetic memory arts that as the size of a magnetic bit decreases, the coercivity of the bit will increase. For example, a 0.2×0.3 nanometer bit may have a coercivity of about 400 Oe [1 Oe=1000/(4*pi) A/m], whereas a 0.8×0.16 nanometer bit may have a coercivity of about 100 Oe [1 Oe=1000/(4*pi) A/m]. In general, the coercivity of a material will decrease as temperature increases. For example a 100 Celsius degree rise in temperature may impart a drop in coercivity by about 50%. Upon a decrease in temperature to the original state, the original coercivity will generally return.

Figure 4:
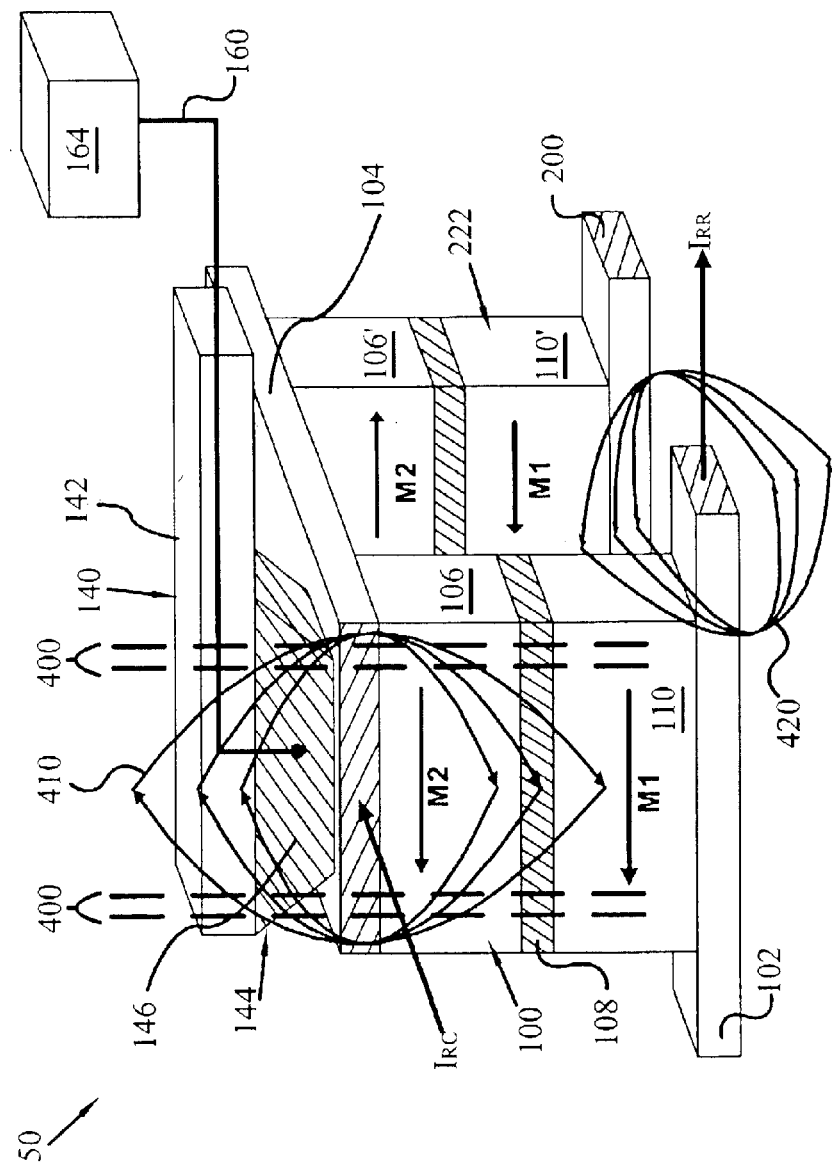
FIG. 4 is a side view illustrating the write operation of the memory shown in FIG. 1.

The ability of the memory 50 to store data is exemplified in FIG. 4. Movable probe 140 is positioned proximate to given memory cell 100 such that the distal tip 144 may thermally influence the memory cell 100. An externally supplied current may be supplied by wire 160 to the heat generator 146 resulting in the generation of heat, represented by dashed lines 400. The heat 400 may be directed into the given memory cell 100. As described in accordance with the read operation above, an externally supplied read current $I_{RC}$ of a predetermined magnitude and direction is supplied through conductor column 104 resulting in the generation of a magnetic field (represented by curved arrows 410). In addition, an externally supplied read current $I_{RR}$ of a predetermined magnitude and direction is supplied through row 102 resulting in the generation of a magnetic field (represented by curved arrows 420).

It shall be noted that the supplied current may be of substantially the same predetermined magnitude as used in the determination of the data bit based on the sensing of resistance described above. Under appropriate circumstances, the sensing of resistance to read a data bit may be performed substantially concurrently with the heating process to achieve the storage of a data bit.

Akin to the description of magnetic field 300 shown in FIG. 3, the magnetic fields 410 and 420 of FIG. 4 are unlikely to adversely affect the data layer 106' of the adjacent memory cell 222 which is further removed from the influence of the magnetic fields 410 and 420 by physical placement. As the heat 400 has elevated the temperature of the data layer 106, the coercivity of data layer 106 is decreased. Whereas magnetic fields 410 and 420 are unable to alter the nature of the magnetic field M2 of the data layer 106 in it's unheated state, the magnetic fields 410 and 420 are sufficient to alter the magnetic field M2 of the data layer 106 in it's heated state. As the combined vector of the magnetic fields 410 and 420 is to the left, M2 will be aligned to point to the left. It is to be appreciated that the relative field strengths of magnetic read fields 300, 310, 410, and 420, are substantially equal as they are generated by the same row and column conductors 102 and 104 operating with substantially the same current. In addition, although the orientation of the soft reference layer 110 may be pinned-on-the-fly, in at least one embodiment the coercivity of the ferromagnetic material comprising the soft reference layer 110 is greater than the combined magnetic fields of 410 and 420, even when reference layer 110 is heated.

In further example, if the direction of current is reversed in row and column conductors 102 and 104, the resultant magnetic field will have a vector in the counter clockwise direction. When heat 400 is present to sufficiently elevate the temperature of data layer 106 and thereby reduce the coercivity, the counter clockwise vector of magnetic field will align M2 to point to the right. It should be noted that if the magnetic field M2 of the data layer 106 is already in line with the magnetic fields 410 and 420 the field M2 will not reverse it's orientation even though the coercivity of the data layer has been sufficiently reduced. Moreover, if the field M2 is already in line with fields 410 and 420 it will remain in line.

Moreover, the combined magnetic fields 410 and 420 as generated by a read current is sufficient to overcome the coercivity of heated data layer 106. As the magnetic read fields 410 and 420 may overcome the coercivity of the heated data layer 106, the orientation of the magnetization M2 may be altered from one orientation to another. In at least one embodiment, the change in orientation performed upon the heated data layer 106 does not affect the orientation of the adjacent non-heated data layer 106'.

As an advantageous result, in at least one embodiment, the bit to bit pitch of the memory cells 100 (distance between the center points of each cell) may be decreased. Such shortening of bit to bit pitch is advantageous as it permits a greater density of memory cells in a given space, and therefore greater memory capacity. In addition, as the magnetic fields are substantially the same for a read or write operation, manufacturing and design issues are simplified. Further, as read operations may substantially outnumber write operations, the relative physical movement as may be required in a write operation may not significantly affect performance of the memory 50.

In at least one embodiment, the ferromagnetic data layer 106 has a lower coercivity then the reference layer 110. The ferromagnetic data layer 106 comprising a material wherein the coercivity is decreased upon an increase in temperature may be made from a material that includes, but it not limited to: Nickel Iron (NiFe), Nickel Iron Cobalt (NiFeCo), Cobalt Iron (CoFe), and alloys of such metals.

The row and column conductors, 102 and 104, may be made from an electrically conductive material. Suitable materials for the conductor 146 may include, but are not limited to: Copper (Cu), Aluminum (Al), Aluminum Copper (AlCu), Gold (Au), Silver (Ag), and alloys of such metals.

Having described the above physical embodiment of the magnetic memory 50, another embodiment may be appreciated to be a computer system incorporating the magnetic memory 50. As has been described above, the physical size of magnetic memory 50 is quite small, thereby permitting a greater volume of storage in the same physical space over contemporary memory devices. Further, the movement of the probe 120 is over very small distances permitting quick access times and reduced latency. A computer with a main board, CPU and at least one memory store comprised of magnetic memory 50 is advantageously fast.

While the invention has been described with reference to the preferred embodiment, it will be understood by those skilled in the art that various alterations, changes and improvements may be made and equivalents may be substituted for the elements thereof and steps thereof without departing from the scope of the present invention. In addition, many modifications may be made to adapt to a particular situation or material to the teachings of the invention without departing from the essential scope thereof. Such alterations, changes, modifications, and improvements, though not expressly described above, are nevertheless intended and implied to be within the scope and spirit of the invention. Therefore, it is intended that the invention not be limited to the particular embodiments disclosed as the best mode contemplated for carrying out this invention, but that the invention will include all embodiments falling within the scope of the appended claims.

I claim:

1. A thermal-assisted nanotip magnetic memory storage device comprising:

a cross point array of magnetic tunnel junction memory cells, the memory cells comprising a material wherein the coercivity is decreased upon an increase in temperature; and at least one movable probe with a distal tip positioned within close proximity of a given memory cell, the probe including, a heat generator joined to the support and forming the distal tip.

2. A thermal-assisted nanotip magnetic memory storage device comprising:

a plurality of parallel electrically conductive rows;

a plurality of parallel electrically conductive columns transverse to the rows, the columns and rows thereby forming a cross point array with a plurality of intersections;

a plurality of magnetic tunnel junction memory cells, each memory cell located at an intersection between a row and column, the memory cells comprising a material with an alterable orientation of magnetization, wherein the coercivity of the alterable material is decreased upon an increase in temperature; and at least one movable probe with a distal tip positioned within close proximity of a given memory cell, the probe including;

a support;

a heat generator joined to the support and forming the distal tip.

3. The thermal-assisted nanotip magnetic memory storage device of claim 2, wherein during a write operation the probe is moved to thermally influence a given memory cell;

wherein the given memory cell is warmed by heat generated by the heat generator of the movable probe;

wherein a current is applied to the corresponding row and column of the given memory cell, the combined current generating a magnetic field between the row and column conductors substantially about the material with an alterable orientation of magnetization of the given memory cell;

wherein the orientation of magnetization of the material may be changed, the magnetic field between the row and column conductors being greater than the coercivity of the heated material.

4. The thermal-assisted nanotip magnetic memory storage device of claim 2, wherein each memory cell further includes a reference layer characterized by a pinned orientation of magnetization.

5. The thermal-assisted nanotip magnetic memory storage device of claim 2, wherein each memory cell further includes a soft ferromagnetic reference layer, the soft reference layer having a non-pinned orientation of magnetization.

6. A thermal-assisted nanotip magnetic memory storage device comprising:

a plurality of parallel electrically conductive rows;

a plurality of parallel electrically conductive columns transverse to the rows, the columns and rows thereby forming a cross point array with a plurality of intersections;

a plurality of memory cells, each memory cell located at an intersection between a row and column, each memory cell including;

at least one ferromagnetic data layer characterized by an alterable orientation of magnetization, the ferromagnetic data layer comprising a material wherein the coercivity is decreased upon an increase in temperature;

an intermediate layer in contact with the data layer;

a ferromagnetic reference layer in contact with the intermediate layer, opposite from the data layer;

at least one movable probe with a distal tip positioned within close proximity of a given memory cell, the probe including;

a support;

a heat generator joined to the support and forming the distal tip.

7. The thermal-assisted nanotip magnetic memory storage device of claim 6, wherein the tip of the probe is sized to be substantially about the same diameter or smaller than the diameter of a given memory cell.

8. The thermal-assisted magnetic memory storage device of claim 6, wherein during a write operation the probe is moved to thermally influence a given memory cell;

wherein the given memory cell is warmed by heat generated by the heat generator of the movable probe;

wherein a current is applied to the corresponding row and column of the given memory cell, the combined current generating a magnetic field between the row and column conductors substantially about the data layer of the given memory cell;

wherein the orientation of magnetization of the data layer may be changed, the magnetic field between the row and column conductors being greater than the coercivity of the heated data layer.

9. The thermal-assisted nanotip magnetic memory storage device of claim 6, wherein the current flowing through the row and column conductors of a given memory cell for a read operation is substantially the same as the current flowing through the row and column conductors of a given memory cell for a write operation.

10. The thermal-assisted nanotip magnetic memory storage device of claim 9, wherein the magnetic field generated between the column and row conductors of a given memory cell is less than the coercivity of the unheated data layer of the given memory cell.

11. The thermal-assisted nanotip magnetic memory storage device of claim 9, wherein the reference layer is a pinned orientation of magnetization.

12. The thermal-assisted nanotip magnetic memory storage device of claim 9, wherein the reference layer is a soft ferromagnetic reference layer, the layer having a non-pinned orientation of magnetization.

13. The thermal-assisted nanotip magnetic memory storage device of claim 6, wherein the cross point array is subdivided into at least two fields, each field receiving one of the movable probes.

14. The thermal-assisted magnetic memory storage device of claim 13, wherein the multiple probes move in tandem along the X, Y and Z axes.

15. The thermal-assisted magnetic memory storage device of claim 13, wherein the multiple probes move individually along one or more of the X, Y and Z axes.

16. The thermal-assisted nanotip magnetic memory storage device of claim 6, wherein movement of the probe permits physical contact between the tip and the cross point array.

17. The thermal-assisted nanotip magnetic memory storage device of claim 6, wherein the heat generator of the movable probe is a planar resistor or a current carrying coil.

18. The thermal-assisted nanotip magnetic memory storage device of claim 6, wherein the intermediate layer is a tunnel layer.

19. The thermal-assisted magnetic memory storage device of claim 18, wherein the tunnel layer is a dielectric material.

20. The thermal-assisted magnetic memory storage device of claim 19, wherein the dielectric material is a material selected from the group consisting of Silicon Oxide, Magnesium Oxide, Silicon Nitride, Aluminum Oxide, Aluminum Nitride, and Tantalum Oxide.

21. The thermal-assisted magnetic memory storage device of claim 18, wherein the tunnel layer is a spacer layer made from a non-magnetic material selected from the group consisting of a 3d, a 4d, and a 5d transition metal.

22. The thermal-assisted magnetic memory storage device of claim 21, wherein the non-magnetic material is a material selected from the group consisting of copper, gold, and silver.

23. A method of data storage in a thermal-assisted nanotip magnetic memory storage device having a plurality of parallel electrically conductive rows, a plurality of parallel electrically conductive columns transverse to the rows, the columns and rows thereby forming a cross point array with a plurality of intersections, a plurality of magnetic tunnel junction memory cells, each memory cell located at an intersection between a row and column, the memory cells comprising a material with an alterable orientation of magnetization, wherein the coercivity of the alterable material is decreased upon an increase in temperature, and at least one movable probe with a distal tip positioned within close proximity of a given memory cell, the probe including, a heat generator joined to the support and forming the distal tip, the method comprising:

positioning the distal tip proximate to a given memory cell;

activating the heat generator of the distal tip to heat the memory cell;

generating a magnetic field by supplying a current through the row and column conductors of a given memory cell, the magnetic field being greater than the coercivity of the heated data layer such that the orientation of magnetization of the data layer may be changed to store a data bit.

24. The method of data storage of claim 23, wherein the step of positioning comprises physically contacting the memory cell with the distal tip.

25. A computer system comprising:

a main board;

at least one central processing unit (CPU) joined to the main board;

at least one memory store joined to the CPU by the main board, the memory store having;

a plurality of parallel electrically conductive rows;

a plurality of parallel electrically conductive columns transverse to the rows, the columns and rows thereby forming a cross point array with a plurality of intersections;

a plurality of magnetic tunnel junction memory cells, each memory cell located at an intersection between a row and column, the memory cells comprising a material with an alterable orientation of magnetization, wherein the coercivity of the alterable material is decreased upon an increase in temperature; and at least one movable probe with a distal tip positioned within close proximity of a given memory cell, the probe including;

a support;

a heat generator joined to the support and forming the distal tip.

* * * * *